United States Patent
Schlack (10) Patent No.: US 6,955,550 B2
(45) Date of Patent: Oct. 18, 2005

(54) EJECTOR LATCH WITH DOUBLE CATCH

(75) Inventor: Richard E. Schlack, Rising Sun, MD (US)

(73) Assignee: Southco, Inc., Concordville, PA (US)

( * ) Notice: Subject to any disclaimer, the term of this patent is extended or adjusted under 35 U.S.C. 154(b) by 85 days.

(21) Appl. No.: 10/738,242

(22) Filed: Dec. 17, 2003

(65) Prior Publication Data

US 2005/0136715 A1 Jun. 23, 2005

(51) Int. Cl.$^7$ ............................................. H01R 13/62
(52) U.S. Cl. ...................................... 439/160; 439/157
(58) Field of Search ................................. 439/152–160

(56) References Cited

U.S. PATENT DOCUMENTS

| | | | |
|---|---|---|---|
| 4,996,631 A | 2/1991 | Freehauf | 361/415 |
| 5,057,029 A | 10/1991 | Noorily | 439/160 |
| 5,222,897 A | 6/1993 | Collins et al. | 439/157 |
| 5,638,474 A | 6/1997 | Lampert et al. | 385/78 |
| 5,669,512 A | 9/1997 | Joslin | 211/41 |
| 5,781,417 A | 7/1998 | Albani et al. | 361/801 |
| 5,791,920 A | 8/1998 | Tomioka et al. | 439/159 |
| 5,801,926 A | 9/1998 | Cutsforth et al. | 361/754 |
| 5,967,813 A | 10/1999 | Ho et al. | 439/159 |
| 5,993,235 A | 11/1999 | Chen | 439/326 |
| 6,003,689 A | 12/1999 | Babineau et al. | 211/41.17 |
| 6,159,036 A | 12/2000 | Daoud | 439/409 |
| 6,259,607 B1 | 7/2001 | Chien | 361/754 |
| 6,266,248 B1 | 7/2001 | Hanas et al. | 361/752 |
| 6,312,275 B1 | 11/2001 | Tortorella | 439/341 |
| 6,496,379 B2 | 12/2002 | Pols Sandhu et al. | 361/754 |
| 2003/0039100 A1 | 2/2003 | Sallnas | 361/727 |
| 2004/0029435 A1 | 2/2004 | Larson | 439/490 |

*Primary Examiner*—Javaid H. Nasri
(74) *Attorney, Agent, or Firm*—Paul & Paul (57) ABSTRACT

A lever-type latch assembly is mountable onto an outer edge rail of a PC board or module. The lever portion pivots on a base mounted to the edge rail. An ergonomically shaped catch slides within the lever and has a pair of tab bearing snap fingers that ride on shoulders on the inner sidewalls of the lever. A pawl extends outwardly from the pivoted end of the lever having a pair of feet straddling the base mount. Alternately, a bump can be included on the base to provide a detent function. The slide catch carries a pair of locking tabs. The base includes a pair of mating locking tabs. The catch is spring biased towards the base pivot position, thereby biasing the catch looking tabs into overlapping contact with the base locking tabs. The catch can have a flat outer face for a product label.

20 Claims, 7 Drawing Sheets

OPEN

FIG. 7
CLOSED

FIG. 8
UNLATCHED

FIG. 7A
CLOSED

FIG. 8A
UNLATCHED

FIG. 9

FIG. 9A
OPEN

EJECTOR LATCH WITH DOUBLE CATCH

RELATED APPLICATIONS

Background of the Invention

The present invention relates to latches and levers, specifically ejector latches and ejector levers which may be adapted for use to secure and release objects in tight quarters, such as printed circuit boards (PC boards) and the like held in cabinets or on electrics card racks.

Electronic modules held in larger enclosures may take the form of PC boards or PC cards mounted to slide in a rack, a tray, or along a rail, or which can be pressed into a connector slot. It has become increasingly important to be able to easily insert such a module with a positive "click-type" (or snap-in type) connection, and with a positive release. Moreover, it has become increasingly important to have an insertion aid and/or a pull-out aid such as a handle or a hold.

A combination inject-eject latch would be suitable for such uses. These devices have been introduced into the art for other applications, also. Such latches can be mounted on the face of a panel or drawer, so that it (they) is (are) capable of injecting a board or module, mounted thereto, into and out of a draw or rack. The latch acts to retain the electronic module within an enclosure in order to maintain the electrical connection thereof even when jarred or jostled.

These latches generally include an elongate handle, of lever-like shape, which can provide a grasping surface to assist in the inserting and removal of the attached board or module from the rack in which it mounts. The handle has pivoted into the rack during the injection operation and pivoted out of the rack during the ejection operation. Attached to the handle is a pawl which when the handle moves engages against surfaces of the associated fixed housing/rack keeper, to "pry" there against thereby providing the injection and ejection force. This movement positions a board to which the lever is attached into a seated position or an unseated position in the housing or rack.

Generally, these latches have utilized a biasing spring or biased spring clip that functions to keep the handle in the downward fully pivoted position. A release is needed to move against the spring force. This has been accomplished with a grasping tab positioned on the biased spring clip, or a release button which compresses the biasing spring which in releases the kept position of the handle and permits upward/outward pivoting movement thereof. This in turn facilitates ejection of the associated board or module, as the pawl connected to the handle pries against a surface of the keeper and thereby moves the board or module to which the lever is mounted into an unseated position. Once this is accomplished, grasping the handle facilitates the removal of the board or module.

PC cards (and PC boards) generally have narrower rack footprint than PC modules, as PC modules are generally larger and heavier boards, which often carry a reasonably wide rail at the outward edge, and a connector at the opposite edge. Often guide pins, attached to a structure mounted at each side edge of a card or board, are employed. These guide pins assist in the proper alignment of the PC card or board or module with seating into the connector.

Manufacturers like Rittal International (Germany), Hoffman-Schroff electronic packaging division (Singapore) of Pentair, Inc. (USA), and Elma Electronic, Inc. (USA) electronic packaging subsidiary of Elma Electronic AG (Switzerland) have provided PCI (peripheral component interconnect) equipment for the computer and electronics industry. These manufacturers each supply module inject-eject CPCI (computer peripheral connection interconnect) cabinet, rack, or housing latches. Representative of these is the Rittal International part no. 3686135 product. These ejectors each require an outer edge rail or its equivalent to provide a needed mounting surface for the latch. This rail, which is mounted to the PC board, acts as a faceplate, mounting surface, much as with the panel or drawer need to mount the latch described above. The Rittal International latch engages a portion of a housing rack structure to inject and eject the connection of the PC module connector.

These PCI latches also each require a separate positive lockout structure to provide a lockdown function. Often used is a separate plate such as a hold down lever or hold down plate. The Rittal International latch has a keeper mounted outwardly from the face of the rail. A positive lockout slide is carried on the assembly as part of a pivoting lever and engages the keeper when the lever is pivoted to the closed position (injected position) to secure the latch in the closed/locked position. Generic to PCI latches is a finger or thumb grasping space, which requires the lever assembly to have a higher profile.

PC card levers and pullers are provided by a number of manufacturers including Calmark Corp. (USA), Richco, Inc. (USA) and Southco, Inc. (USA). Calmark provides a part no. 107-20 PC card inserter-extractor latch. This is a one-piece lever, which is pinned to a PC card near its outside edge to enable it to pivot. The lever includes a snap-type detent foot, which engages a second pin extending through the card when the lever is in the downward/closed position. This engagement acts as a pressure or friction hold down. The lever has an upraised finger grasping end. The opposite end of the lever carries a pawl which engages a C-shaped housing or rack mounted flange which acts as the latch keeper. The lever is manually pivoted to the outward position to disengage pawl from the keeper. In doing so, the detent force is overcome.

Richco provides a part no. R1107 PC card inserter-extractor latch. This latch is similar in shape and function to the Calmark latch, and similarly mounted to pivot. An exception is that the Richco lever is without the detent foot or a second pin.

Southco provides a part no. 90-0-6503-11 PC card inject-eject latch. The Southco latch pivots on a rivet through the PC card positioned near its outside edge. The Southco latch has a very long handle, which is grasped by drawing a finger and thumb along the PC card to catch the handle. The handle is without a detent or other closed/locked position-holding structure. It is intended to seat down on the outside edge of a card when in the closed position. This Southco handle carried a pair of rounded foot extensions at its opposite ends which act as pawls to engage a curved spring flange which is rack or housing mounted. This engagement affects the injection and ejection functions of the latch.

In attempt to make smaller footprints for electronic component housings and racks, and to include more component modules in a smaller space as circuits become smaller, there is an ever increasing desire to pack PC cards, PC modules and the like closer together and with less housing clearance.

Moreover, clearances between the outward edge of each PC card, board or module and the outward end of the housing or rack are also being reduced. Where a card, board or module uses an outward edge rail for support the necessity for a low profile lever or latch is increased.

The goals and issues of designing evermore simple, less costly and stronger levers and latches are constantly in the forefront. Plastic parts are generally less costly to manufacture than metal parts. However, depending upon the design, plastic parts are generally weaker, have lower heat tolerance, and are less durable than metal parts.

Ease of assembly of a lever or latch assembly is also a goal. Ease of operation and the absence of binding and wear failures are also concerns.

It therefore has become desirable to provide a card or module injection-ejection latch with an elongate, lever-like handle and a low profile when in the closed position.

It is further desirable to provide this inject-eject latch with a base structure that is mountable to the outer edge rail for a PC card, board or module.

It is also desirable to provide this inject-eject latch with a positive lockout at its closed or rotated down position, and a positive detent-like function at its open position without adding additional parts.

It is additionally desirable to provide this inject-eject latch with a structure for its catch, pawl, lockout and detent functions that are each implemented in with plastic parts.

It is even further desirable to provide this inject-eject latch with a snap in assembly.

It is further additionally desirable to distribute the stresses on the plastic catch by incorporating a multiple catch structure without increasing the space requirements for the latch.

It is lastly desirable to create an ergonomic design for the catch member of the latch.

SUMMARY OF THE INVENTION

An object of the present invention is to provide an improved PC board rotatable lever ejector latch design which incorporates double catch members for effecting a positive lockout at the latch closed position, i.e., the rotated down position, wherein the locking mechanism can be made of plastic or other lighter material and be strong enough to withstand the forces normally handled by metal parts.

A second object of the present invention is to provide an ergonomic shaped catch member.

A third object is to provide a detent function at the fully open position, i.e., the fully rotated up position.

A further object is to incorporate a label bearing surface on the catch, thereby eliminating a label bearing surface on the lever.

The objects of the present invention and other features are incorporated into a rotatable lever-type inject-eject latch for a PC board, PC card, electronic module, or other device that is inserted and removed from a housing or a rack. This lever assembly has three major components of which two can be made of plastic or other moldable material. A biasing spring completes the component list for a total of four assembled parts.

This lever assembly includes a base member, which is mounted to the PC board et al. directly or via an edge rail. The base has an upward-outstanding wall on which is located a pivot bearing point including a pivot. The outer edge of the base standing wall is rounded.

The base also includes a pair of locking tab projections, which can be horizontal projecting, i.e., parallel to the outer edge of the PC board or edge rail if present. These tabs can be finger or wedge shaped and are positioned sequentially, one behind the other along a longitudinal line extending along the base.

An elongate lever member is pivotally mounted at near one end thereof to the pivot at the bearing point on the base standing wall. A pawl is molded into the disparate end of the lever to extend from the pivot point longitudinally outwardly. This pawl is claw shaped and has a top solid lip implemented with a transverse bar member, and a bifurcated lower lip implemented with two parallel extending feet.

The body of the lever is hollow with an elongate rectangular opening in the top surface thereof. A recessed slide way is implemented in the top surface of the lever with the presence of undercut shoulders about the opening. Longitudinally extending shoulders run along each inner sidewall of the lever.

The end of the lever opposite the pawl is feather tapered for ergonomic grasping. At this grasping end of the lever are included a pair of downwardly extending guide pins, which can project through mating openings in a edge rail to facilitate assembly alignment of the latch thereto.

The entire lever structure, including the pawl portion can be manufactured as a single injection molded plastic part.

A catch is mounted to slide on the lever. This catch has an ergonomic shaped operating tab at one end which extends upward-outwardly. The catch also has a flat plate configuration which fits into the lever recessed slide way and rides on the undercut shoulders thereof. The flat plate outer face of the catch is suitable for carrying a product label.

A pair of locking projecting tabs are positioned in sequential fashion, one behind the other, along a longitudinal axis of the catch. These catch locking tabs are approximate each longitudinal end of the catch and on the underside of the catch so as to operate within the lever opening. These catch locking tab projections face the pivot point of the lever and therefore face the respective base locking tab projections in the assembled structure. Like the base locking tabs, the catch locking tabs are sequentially spaced one behind the other at a distance consistent with the distance between the base locking tabs. The catch locking tabs extend parallel to the extension of the catch which in turn extends parallel to the extension of the lever, with the catch locking tabs extending parallel to the edge of the PC board and parallel to the extension of the base locking tabs when the lever is in the closed position. When the catch locking tabs engage the base locking tabs, the catch and lever are locked into fixed position with respect with the base. This engagement can be an overlapping of the respective locking tabs.

To facilitate locking engagement each of the base locking tabs and the catch locking tabs include a ramped camming surface at the end thereof. When the catch locking tabs are rotated into the base locking tabs the respective ramped camming surfaces engage and the catch is forced away from the lever pivot location, i.e., the pawl portion of the lever.

At the operating tab end of the catch is a spring housing which has a circular hole for containing a coiled biasing spring, which also seats against the adjacent end of the lever when assembled. This biasing spring biases the catch towards the pawl portion of the lever, this biased position being the catch locking position. Whether the lever is in the locked position or not will depend upon whether the catch and the lever are rotated to the closed position or rotated into to another angular position.

The catch also has a longitudinally and upward-outwardly extending arm at the end opposite the operating tab. A portion of this arm engages the rounded outer edge of the base standing wall when the spring biases the catch towards the pawl end of the lever. This position is the locking position for the catch. The extending arm has a projecting tab or finger that provides an angled inner surface for engaging the base standing wall. The angled inner surface can include an inward corner. When a bump, or outward circular protrusion is present on the rounded outer edge of the base standing wall, a detent is created with the inward corner of the catch extending arm. This detent will hold the lever in position at its extreme rotational position at the ejection end position.

A guide structure extends below the ergonomic tab location on the catch and in the direction away from the lever pawl. This guide structure acts to keep the catch from unintentionally exiting the lever opening when the catch is at its far locking position.

As an alternative to the detent bump on the rounded outer edge of the base standing wall, the lever can be held at its extreme rotational position being the ejection end position by an axial interference of the pawl feet with the base standing wall. This can be accomplished by have the free end of the pawl feet come into a friction contact with the base standing wall. A tapering inwardly of the free ends of each pawl foot will create this axial interference. Alternatively to this taper, a juxtaposed inward facing tabs or shoulders can be placed at the extreme free ends of the pawl feet. When the pawl is in its extreme eject position these tabs or shoulders come into friction contact with the base standing wall providing a holding function.

The catch also includes a pair of parallel extending snap fingers, which extend into the lever opening. Each snap finger has a tab projecting transversely at its end. These snap finger tabs engage the lever inner sidewall shoulders to keep the catch within the lever opening and permit the slide operation. The catch can be manufactured as a single injection molded plastic part.

BRIEF DESCRIPTION OF THE DRAWINGS

The features, advantage and operation of the present invention will become readily apparent and further understood from a reading of the following detailed description with the accompanying drawings, in which like numerals refer to like elements, and in which.

DETAILED DESCRIPTION OF THE INVENTION

The present invention is an improved PC board mounted rotatable, inject-eject lever latch assembly, which incorporates double catch action for spreading the stresses on the catch member thereof. The latch provides both catch (lockout) functional structure and detent (hold open) functional structure. The latch assembly is implemented in three major component parts, a base member, a lever member and a catch member; and a separate biasing spring. Two of the component parts, the lever and the catch, can be made of injection molded plastic material.

The present invention has the catch member carried on the lever member and moveable in relationship thereto and to the base member. The invention also places a catch lockout on the catch member as far from the lever rotation pivot point position as the structure will permit, and places a detent as close to the pivot point position as the structure will permit. Plastic material being for both the lever and catch member permits ergonomic features to be incorporated in each. A pair of smaller locking projections, on the catch member, act as the catch points for locking the catch and lever to the base member. The two smaller catch points replace a larger one needed for operation. Thus the latch assembly has a lower closed profile and the two latch points distribute the stresses and applied load over a greater section of the catch member, permitting the use of lower strength materials, such as plastics. The detent in one embodiment thereof may be implemented with structure which applies an axial interference between the lever member and the base member.

Figure 1:
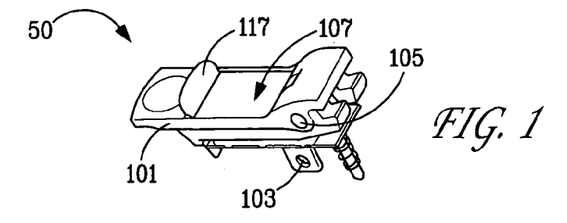
FIG. 1 is a perspective partial view of the ejector latch with double catch of the present invention in the closed position.
Figure 2:
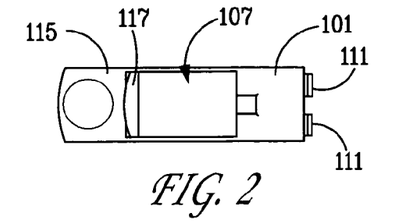
FIG. 2 is a top plan view of the closed ejector latch of FIG. 1.
Figure 3:
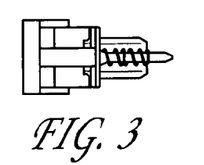
FIG. 3 is a pawl side end view of the closed ejector latch of FIG. 1.
Figure 4:
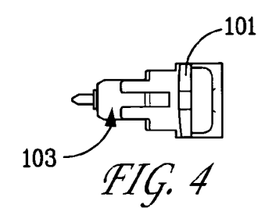
FIG. 4 is a ergonomic tab side end view of the closed ejector latch of FIG. 1.
Figure 5:
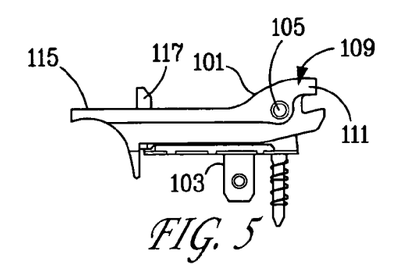
FIG. 5 is a side elevation view of the closed ejector latch of FIG. 1, with the opposite side elevation being the mirror image thereof.
Figure 6:
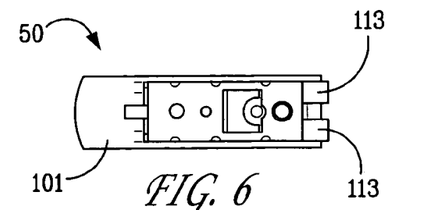
FIG. 6 is a bottom plan view of the closed ejector latch of FIG. 1.

The inject-eject, rotatable, lever-type latch 50, FIG. 1, has its lever member 101 mounted to its base member 103 with a pivot pin 105 connection, FIG. 1. A catch member 107 is carried on the lever 101. The lever 101 is substantially elongate and rectangular, FIGS. 2–6. At one end of the lever 101 approximate the pivot bearing point of the pivot pin 105, is a claw shape pawl 109. This pawl 109 has an upper lip which is implemented by a transverse bar 111 and a lower lip implemented by a pair of parallel projecting feet 113. The opposite end of the lever 101 is a feather tapered tail, grasping surface 115.

The catch member 107 seats into and rides on the top plane of the lever 101 for slide movement in respect thereto. At the end of the catch 107 approximate the feather tapered tail 115 of the lever 101 is an upstanding curved, ergonomic shaped finger tab 117. The tab is moved by the operator to move the catch 107 with respect to the lever 101 and the base 103, which remain fixed together by the pivot pin 105.

Figure 7:
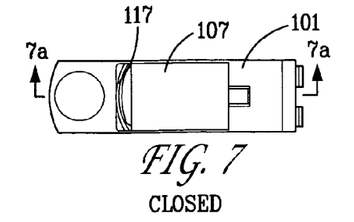
FIG. 7 is a plan view of the ejector latch of FIG. 1 in the closed and locked out position.
Figure 7A:
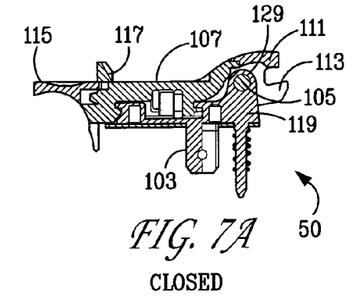
FIG. 7a is a cross-section view of the ejector latch taken as shown in FIG. 7.
Figure 8:
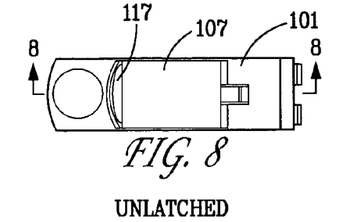
FIG. 8 is a plan view of the ejector latch of FIG. 1 in the closed but unlocked (unlatched) position.
Figure 8A:
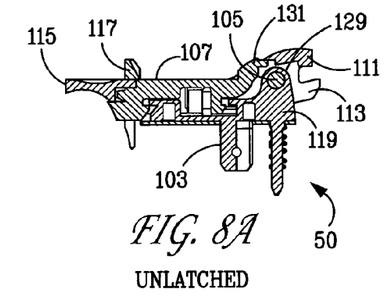
FIG. 8a is a cross-section view of the ejector latch taken as shown in FIG. 8.
Figure 9:
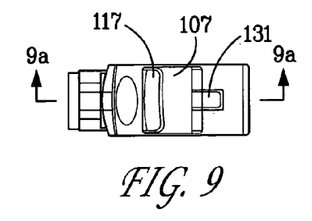
FIG. 9 is a plan view of the ejector latch of FIG. 1 in the fully open position.
Figure 9A:
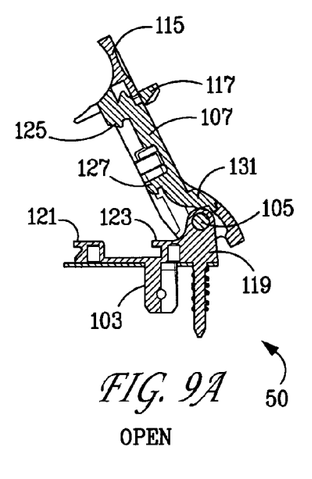
FIG. 9a is a cross-section view of the ejector latch taken as shown in FIG. 9.

A cross-section of the latch assembly is shown in FIGS. 7a, 8a and 9a, each of which views is taken as shown respectively in FIGS. 7, 8 and 9. The base 103 includes an upward-outwardly standing wall 119 that carries the pivot point for the pivot pin 105, FIGS. 7a, 8a, 9a. The base 103 has a pair of sequentially spaced locking projection tabs 121, 123, one positioned behind the other. Respective mating catch locking projection tabs 125, 127, are likewise positioned sequentially, one behind the other. The catch locking tabs 125, 127 face the base locking tabs 121, 125. When the tab 121 engages and overlaps the tab 125 and the tab 123 engages and overlaps the tab 127, the latch 50 is in the closed and locked position, FIG. 7a. In the closed and locked position, FIG. 7a, the catch 107 is fixed to the base 103 thereby fixing the lever 101 carrying the pawl 109 as well.

The base 103 standing wall 119, FIGS. 7a, 8a, 9a, has a round outer face 129 upon which rides an outwardly extending arm 131 from the catch 107. This occurs when the catch 107 is biased forward toward the pivot 105, FIGS. 7a and 9a. When the catch 107 is operated to the unlatched position, FIG. 8a, the catch 107 extending arm 131 is retracted away from the base 103 standing wall 119, FIG. 8a.

Figure 9B:
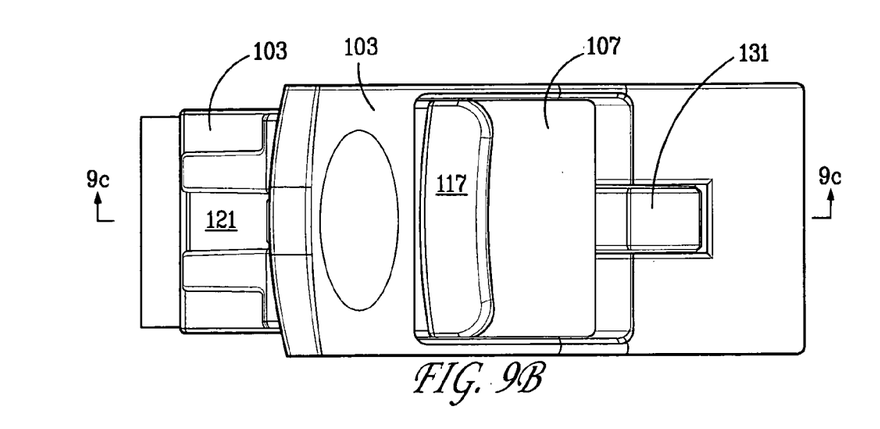
FIG. 9b is an enlarged top elevation view of the fully open latch, this figure being an enlargement of FIG. 9.
Figure 9C:
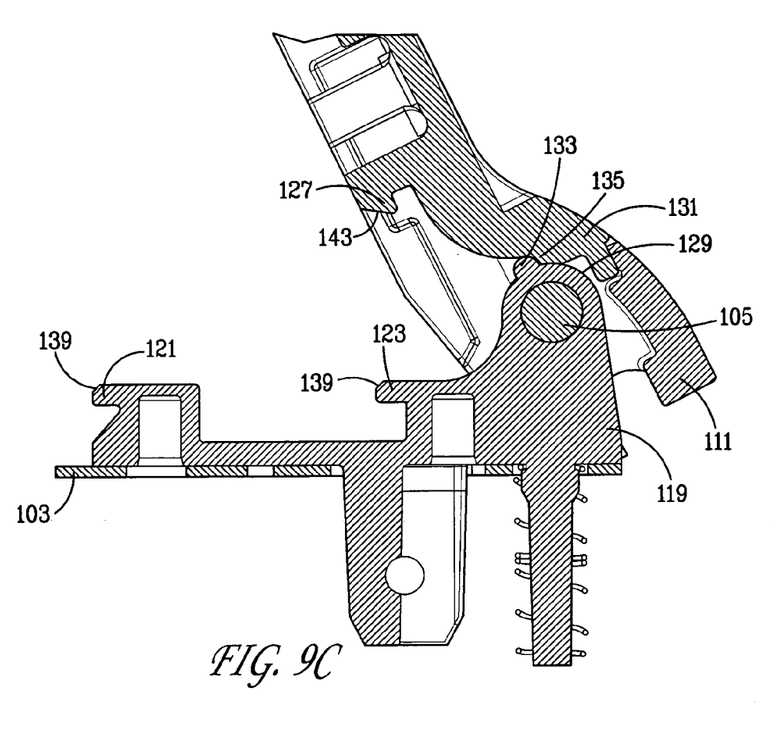
FIG. 9c is p cross-section of the fully open ejector latch having a detent bump and taken as shown in FIG. 9c.

FIG. 9b is an enlarged view of FIG. 9, both of which show the latch 50 in the fully rotated open position. FIG. 9c is an enlarged partial cross-section of the fully opened latch 50, taken as shown in FIG. 9b. In this view, FIG. 9c, the base 103, standing wall 119, round outer face 129 has a round detent bump 133 on it. This detent bump 133 seats into a notch 135 in the extending arm 131 formed by an inward corner on the inner surfaces thereof. Each of the base 103 locking tabs 121, 123 is shown with its respective ramped ends 137, 139. The catch locking tabs 125 (not shown) and 127, each have respective ramped ends 141 (not shown) and 143.

The base 103, of course is fixed, with the lever 101 and its carried catch 107 being movable, rotationally upward and downward, in FIG. 9c. The taper of each engaging ramp end, i.e., 137 onto 141 and 139 onto 143 is angled such that when the lever 101 is rotated down, carrying the catch 107 with it, the movable ramp surface 141 engages the fixed ramp surface 137, with the same being for the movable ramp surface 143 engaging the fixed ramp surface 139, so that the catch 107 is moved back away from the pivot 105 by the camming operation of the interacting ramped surfaces.

Figure 10:
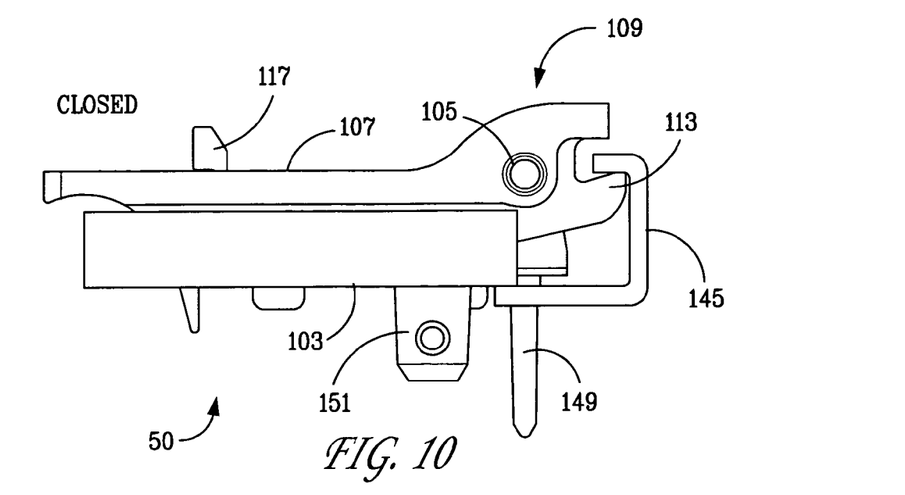
FIG. 10 is a side elevation of the ejector latch of FIGS. 1 and 7a in the closed and locked out position while engaging a chassis keeper.
Figure 11:
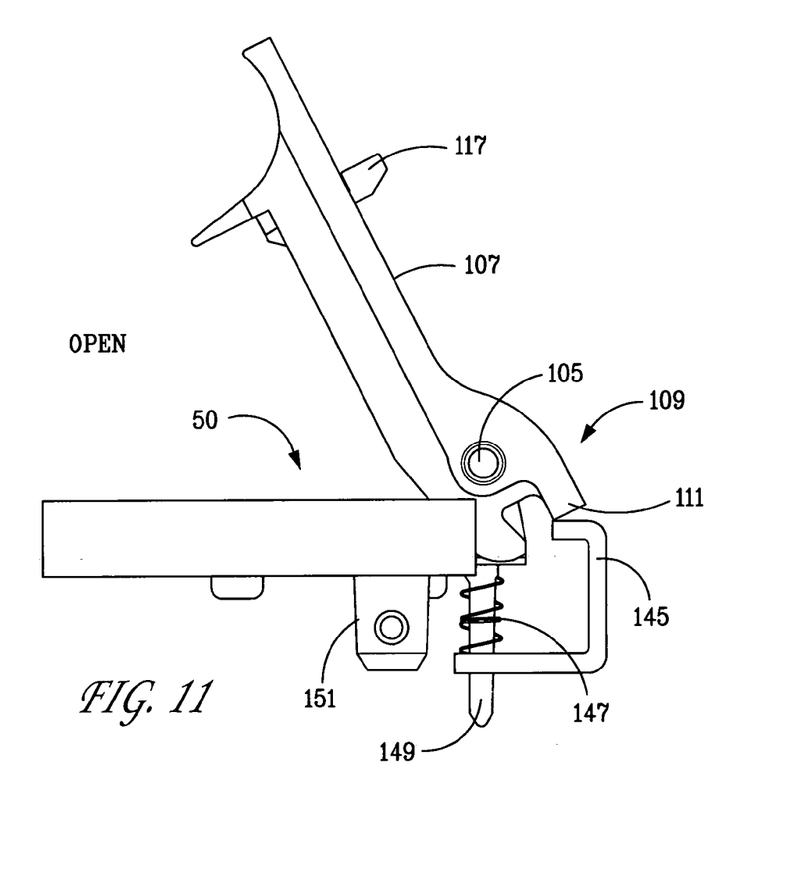
FIG. 11 is a side elevation view of the ejector latch of FIGS. 1 and 9a in the fully open position while engaging a chassis keeper.
Figure 12:
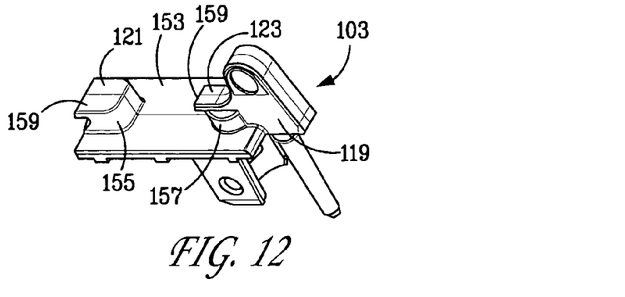
FIG. 12 is a perspective view of the base member of the ejector latch of FIG. 1.
Figure 13:
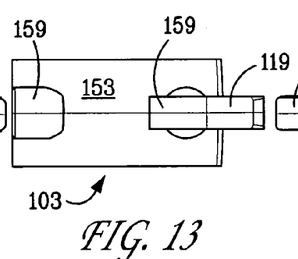
FIG. 13 is a top plan view of the base member of FIG. 12.
Figure 14:
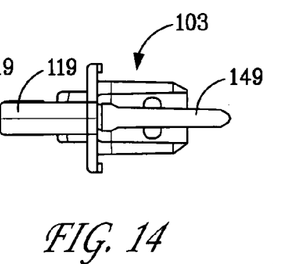
FIG. 14 is a pawl side end view of the base member of FIG. 12.
Figure 15:
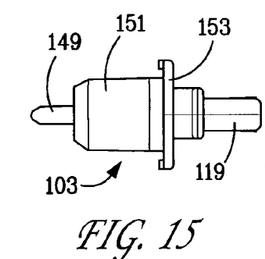
FIG. 15 is an ergonomic tab side end view of the base member of FIG. 12.
Figure 16:
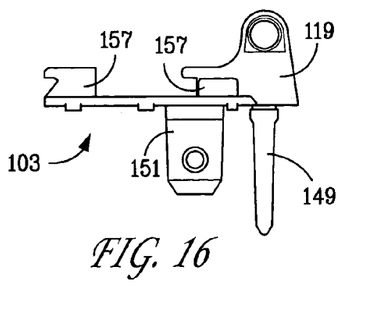
FIG. 16 is a side elevation view of the base member of FIG. 12, the opposite side elevation being a mirror image thereof.
Figure 17:
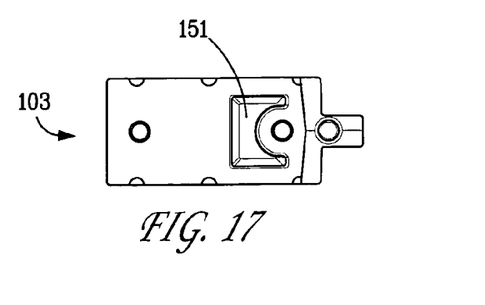
FIG. 17 is a bottom plan view of the base member of FIG. 12.
Figure 18:
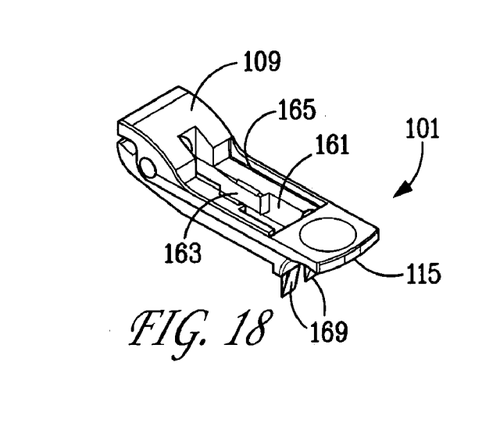
FIG. 18 is a perspective view of the lever member of the ejector latch of FIG. 1.
Figure 19:
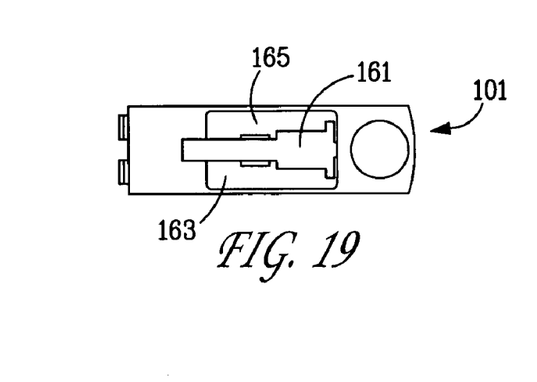
FIG. 19 is a top plan view of the lever member of FIG. 18.
Figure 20:
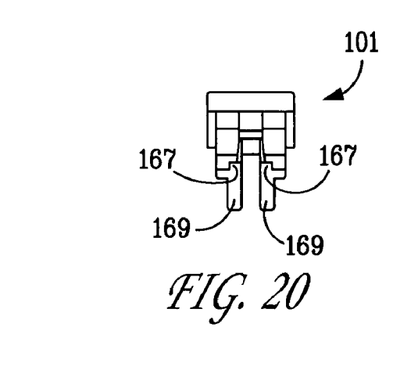
FIG. 20 is a pawl side end view of the lever member of FIG. 18.
Figure 21:
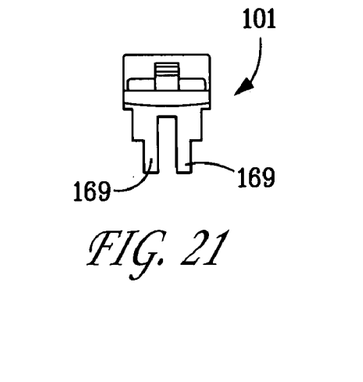
FIG. 21 is an ergonomic tab side end view of the lever member of FIG. 18.
Figure 22:
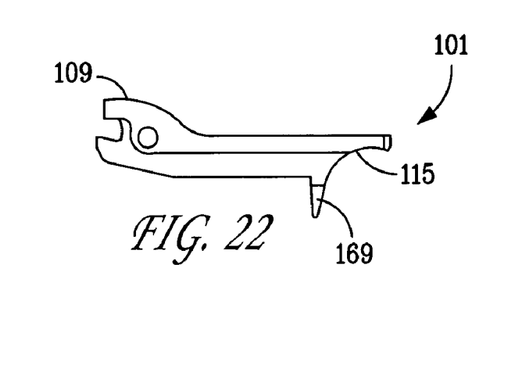
FIG. 22 is a side elevation view of the lever member of FIG. 18, the opposite side elevation being a mirror image thereof.
Figure 23:
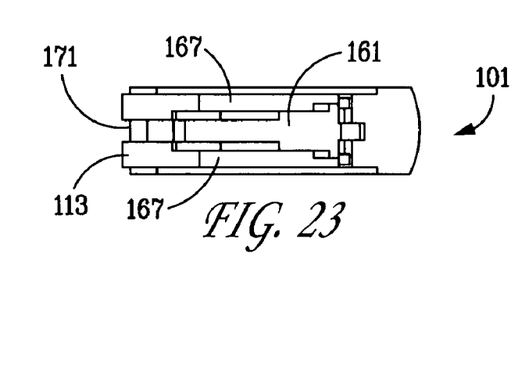
FIG. 23 is a bottom plan view of the lever member of FIG. 18.
Figure 24:
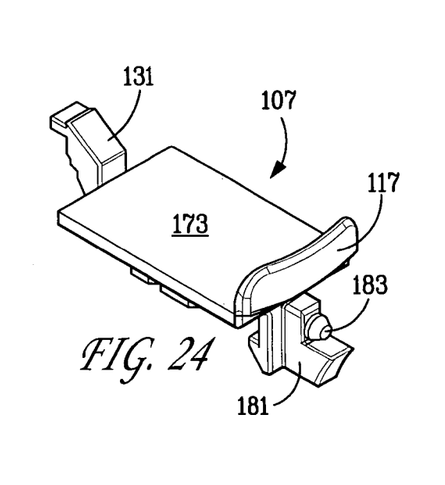
FIG. 24 is a perspective view of the catch member of the ejector latch of FIG. 1.
Figure 25:
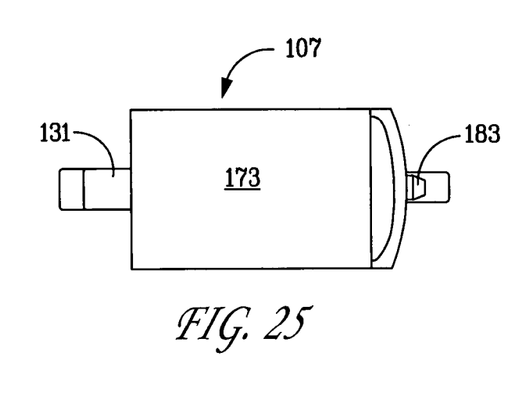
FIG. 25 is a top plan view of the catch member of FIG. 24.
Figure 26:
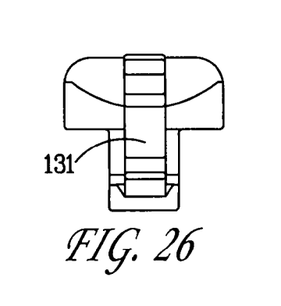
FIG. 26 is a pawl side end view of the catch member of FIG. 24.
Figure 27:
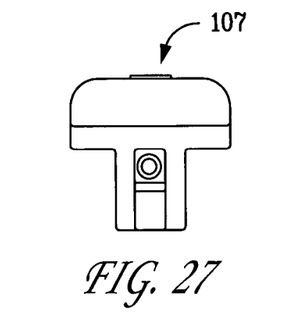
FIG. 27 is an ergonomic tab side end view of the catch member of FIG. 24.
Figure 28:
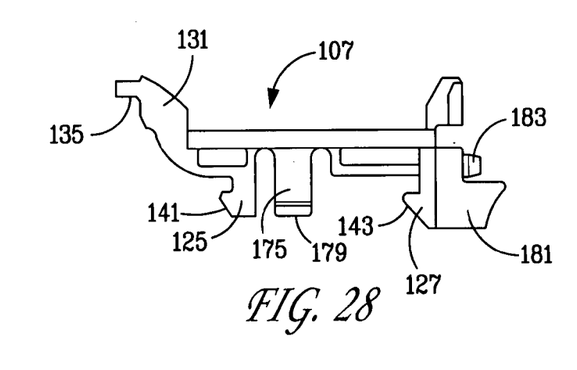
FIG. 28 is a side elevation view of the catch member of FIG. 24, the opposite side elevation being a mirror image thereof.
Figure 29:
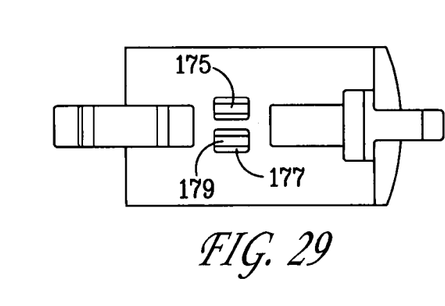
FIG. 29 is a bottom plan view of the base member of FIG. 24.

FIGS. 10 and 11 shown the latch 50 engaging a chassis keeper 145, with FIG. 10 illustrating the closed position and FIG. 11 illustrating the open position. In fact, in FIG. 11 the latch 50 is partially moved upward by the force of the ESD spring 147 which rides on the guide insertion pin 149. The base 103 can be attached to a PC board edge rail with the downward extending attachment or anchoring member 151.

The configuration of the base member 103 can be seen in detail in FIGS. 12–17. Base member 103 has a flat plate portion 153 upon which the locking tab projections 121, 123 sit. Each locking tab projection 121, 123, has a base 155, 157, respectively, and a flat blade-like tab projection 159. The second tab projection 123 is formed integral with the standing wall 119. The guide insertion pin 149 and the base attachment member are positioned on the opposite side of the flat plate 153 from the locking tabs projections 121, 123 and the standing wall 119 opposite side. The base member 103 can be a single piece machined metal part. The base 103 can also be made as a fiberglass reinforced resin part or an injection molded plastic part.

The configuration of the lever member 101 is shown in detail in FIGS. 18–23. The lever 101 is essentially of flat shape with an opening 161 through its body. The claw shaped pawl 109 is molded into one end, while the feather tapered tail 115 is molded into the opposite end. A recessed slide way 165 faces the top face of the lever 101. This slide way is defined by the undercut shoulders 163 in the upper face of sidewalls of the opening 161. The catch 107 slides on these undercut shoulders 165. Beneath the undercut shoulders 165 in the inner sidewalls of the opening 161 are juxtaposed shoulders 167 extend longitudinally along the sidewalls of the opening 161.

Approximate the feather tapered tail area 115 is a pair of assembly guide pins 169 which extend downwardly. The lever member 101 is intended to be made as a one piece injection molded part. As with the base 103 discussed above, and the catch 107 discussed below, the lever 101 may have certain surfaces polished, machined, or otherwise machined after molding or forming. However, this machining is not required unless specified tolerances, clearances, and fits-of-shape are specified in manufacturing.

The pawl feet 133 can each carry a protrusion tab 171 at their extreme outer ends or can have their juxtaposed surfaces tapered towards one another or both.

The configuration of the catch 107 is shown in detail in FIGS. 24–29. The catch 107 has a flat plate-like portion 173 on which a product label may be attached. The upstanding operator tab 117 is curved to a ergonomic shape. The extending arm 131 has at least one notch 135 for engaging the detent bump 133 on the base standing wall 119. Extending downwardly from the plate structure portion of the catch 107 are a pair of snap fingers 175, 177, each within a juxtaposed facing end tab 179. The snap fingers 175, 177 extend into the lever opening 161 and the snap finger tabs 179 engage the longitudinal shoulders 167, for snap-in assembly of the catch 107 into the lever 101. A lip structure 181 extends outwardly from beneath the operator tab 117 end of the catch. This lip also carries the biasing coil spring 183 which operates to bias the catch 107 away from the feather tapered end 115 of the lever 101.

Many changes can be made in the above-described invention without departing from the intent and scope thereof. It is therefore intended that the above description be read in the

What is claimed is:

1. A rotatable lever-type latch for mounting to an outer edge rail of a PC board or module for selectively engaging various portions of a keeper for effecting an injection or an ejection of said PC board or module, comprising:
   a base capable of being attached to said outer edge rail;
   a lever pivotally mounted to said base and rotatable between an outward extending open position and a closed position parallel to said edge rail;
   a pawl connected to one end of said lever, said pawl engaging said various portions of said keeper, upon the rotation of said lever between positions, which positions are a rotated open and a rotated closed position;
   a catch, mounted onto said lever for slidable engagement therewith, said catch being biased to a first position;
   wherein said base includes a pair of locking projections;
   wherein said catch includes a pair of locking projections; and
   wherein said catch locking projections each engage a respective one of said base locking projections when said lever is in said closed position.

2. The latch of claim 1, wherein said base includes an upward-outwardly standing wall, said lever being pivotally mounted to said base by a pivot bearing on said base standing wall.

3. The latch of claim 2, wherein said catch includes a longitudinally-outwardly and upward-outwardly extending arm at the end thereof adjacent said base standing wall, and wherein said catch is spring biased to said first position, said first position being the catch locking position wherein said catch extending arm is in contact with said base standing wall.

4. The latch of claim 3, wherein said base locking projections are sequentially spaced and extend away from said base projecting wall, and wherein said catch locking projections are sequentially longitudinally spaced along said catch and extend towards said base projecting wall and towards said base locking projections.

5. The latch of claim 4, wherein when said catch is spring biased to said catch locking position said catch locking projections engage said base locking projections.

6. The latch of claim 5, wherein each said catch locking projection includes a tapered camming surface which enables the respective catch locking projection to ride over the respective base locking projection by camming against the end of the base locking projection thereby moving said catch away from said base standing wall pivot bearing position against the spring biasing force.

7. The latch of claim 6, wherein said lever has an elongate opening there through, a recessed slide way on the outer face thereof, and longitudinally extending shoulders on each inner sidewall; and wherein said catch has a flat plate-like portion which slides in said recessed slide way of said latch, an extending arm projecting from the end thereof adjacent said base standing wall, and an ergonomic shaped finger tab extending outwardly from the end opposite said extending arm.

8. The latch of claim 7, wherein said catch also includes a pair to parallel extending snap fingers which engage said lever inner sidewall shoulders and retain said catch in said lever recessed slide way while permitting the longitudinal movement of said catch with respect to said lever.

9. The latch of claim 8, wherein at least one of said catch locking projections is adjacent the location of said ergonomic shaped finger tab, and wherein said latch also includes a detent adjacent said base standing wall pivot bearing location.

10. A inject-eject latch for computer a board, card, and module, mountable into a rack or housing, said latch comprising:
    a base mountable to said board, card and module having an projecting wall with a pivot bearing point;
    a lever pivotally mounted to said base at said bearing point;
    a pawl connected to said lever and moved by the pivotal operation thereof for engaging a keeper associated with a rack or housing; and
    a catch mounted on said lever for longitudinal slide operation with respect to said lever between a locking position and an unlocked position;
    wherein said catch carries a plurality of locking projections;
    wherein said base carries a plurality of locking projections; and
    wherein when said catch is in said locking position said catch and said base locking projections engage respectively one to one to lock said lever to said base.

11. The inject-eject latch of claim 10, also including a biasing means for biasing said catch to said locking position, and wherein said catch locking projections are sequentially positioned and wherein said base locking positions are sequentially positioned.

12. The inject-eject latch of claim 11, wherein when said catch is in said locking position and said lever is locked to said base and wherein said locking inhibits pivotal rotation.

13. The inject-eject latch of claim 12, wherein said lever rotates between an open position and a closed position and which rotational movement carries said pawl respectively between an eject end position and an inject end position, and wherein said pawl includes a pair of parallel extending feet which straddle said base projecting wall, wherein said pawl feet axially interfere with said base projecting wall when said pawl is in said eject end position.

14. The inject-eject latch of claim 13, wherein said pawl feet carry juxtaposed projections, at the free ends thereof, said projection providing said axial interference with said base projecting wall.

15. The inject-eject latch of claim 13, wherein said pawl feet taper inwardly toward each other at the free ends thereof and thereby reducing the space there between, said taper providing said axial interference with said base projecting wall.

16. The inject-eject latch of one of claim 14 or 15, wherein said lever includes a longitudinal opening accessing pair of interior longitudinal sidewalls thereof, each said interior sidewall having a longitudinally extending shoulder, and wherein said catch includes a pair of projecting snap fingers each having tabs at the free ends thereof, said fingers extending into said lever opening with said catch finger tabs engaging said respective lever inside shoulders.

17. The inject-eject latch of claim 16, wherein said catch finger tabs engagement with said lever shoulders permits the longitudinal sliding of said catch with respect to said lever.

18. The inject-eject latch of one of claim 14 or 15, wherein said base projecting wall includes a rounded outer face about said pivot bearing point, and wherein said catch includes and longitudinally outwardly and upward-outwardly projecting arm, said arm having a portion of the surface thereof in contact with the projecting wall rounded outer face when said catch is biased to said locking position.

19. The inject-eject latch of claim 13, wherein said base projecting wall includes a rounded outer face about said pivot bearing point, and wherein said catch includes and longitudinally-outwardly and upward-outwardly projecting arm, said arm having a portion of the surface thereof in contact with the base projecting wall rounded outer face when said catch is in said locking position, and also including a projecting bump on said base projecting wall rounded outer face, wherein said catch projecting arm engages said bump in a detent function when said lever and pawl are in said eject end position.

20. The inject-ejection latch of claim 19, wherein said catch also includes an upward-outwardly projecting ergonomic shaped finger tap adjacent the end thereof opposite said outwardly projecting arm, and wherein said latch includes a finger grip tail at the free end thereof adjacent said catch ergonomic shaped finger tab.

* * * * *

UNITED STATES PATENT AND TRADEMARK OFFICE
CERTIFICATE OF CORRECTION

PATENT NO.    : 6,955,550 B2
DATED         : October 18, 2005
INVENTOR(S)   : Richard E. Schlack It is certified that error appears in the above-identified patent and that said Letters Patent is hereby corrected as shown below:

Column 1,
Line 3, delete "RELATED APPLICATIONS";
Line 5, center and capitalize "Background of the Invention";
Line 10, replace "electrics" with -- electronic --;
Line 22, delete the comma "," between "applications" and "also";
Line 46, delete "in";

Column 5,
Line 13, replace "have" with -- having --;
Line 17, delete "a" before "juxtaposed";

Column 8,
Line 5, replace "shown" with -- show --;
Line 31, replace "163" with -- 165 --;
Line 35, insert -- which -- between "167" and "extend";
Line 46, replace "133" with -- 113 --;

Column 9,
Line 62, replace "pair to parallel" with -- pair of parallel --;

Column 10,
Line 4, should read -- An inject-eject latch for a computer board, card, and --;
Line 66, replace "and" (second occurrence) with -- a --;

Column 11,
Line 6, replace "and" (second occurrence) with -- a --;

UNITED STATES PATENT AND TRADEMARK OFFICE
CERTIFICATE OF CORRECTION

PATENT NO. : 6,955,550 B2
DATED : October 18, 2005
INVENTOR(S) : Richard E. Schlack It is certified that error appears in the above-identified patent and that said Letters Patent is hereby corrected as shown below:

Column 12,
Line 4, replace "inject-ejection" with -- inject-eject --;
Line 6, replace "tap" with -- tab --.

Signed and Sealed this

Seventh Day of February, 2006

JON W. DUDAS
*Director of the United States Patent and Trademark Office*